United States Patent
Mizumoto

(10) Patent No.: US 10,036,967 B2
(45) Date of Patent: Jul. 31, 2018

(54) LITHOGRAPHY APPARATUS, LITHOGRAPHY METHOD, AND ARTICLE MANUFACTURING METHOD

(71) Applicant: CANON KABUSHIKI KAISHA, Tokyo (JP)

(72) Inventor: Kazushi Mizumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 9 days.

(21) Appl. No.: 14/935,761

(22) Filed: Nov. 9, 2015

(65) Prior Publication Data

US 2016/0139515 A1  May 19, 2016

(30) Foreign Application Priority Data

Nov. 13, 2014 (JP) .................. 2014-231051

(51) Int. Cl.
*G03F 9/00* (2006.01)
*G03F 7/20* (2006.01)

(52) U.S. Cl.
CPC ........ *G03F 9/7046* (2013.01); *G03F 7/70775* (2013.01)

(58) Field of Classification Search
CPC .. G03F 7/70775; G03F 9/7046; G03F 9/7049; G03F 7/70641
See application file for complete search history.

(56) References Cited

U.S. PATENT DOCUMENTS

| | | | |
|---|---|---|---|
| 4,958,082 A * | 9/1990 | Makinouchi | G03F 9/70 250/548 |
| 5,850,291 A | 12/1998 | Tsutsui | |
| 2003/0054574 A1 * | 3/2003 | Tanaka | G03F 9/7003 438/4 |
| 2008/0094593 A1 * | 4/2008 | Shibazaki | G03F 7/70725 355/53 |

FOREIGN PATENT DOCUMENTS

| | | |
|---|---|---|
| JP | 09260274 A | 10/1997 |
| JP | 4449457 B2 | 4/2010 |

* cited by examiner

*Primary Examiner* — Michelle M Iacoletti
(74) *Attorney, Agent, or Firm* — Rossi, Kimms & McDowell LLP

(57) ABSTRACT

A lithography apparatus includes: a stage configured to hold the substrate; a scope configured to measure a position of a mark formed on a surface of the substrate; and a controller configured to control movement of the stage to form the pattern based on the position of the mark. When there is a rotation shift of the surface of the substrate about a first axis of one of X-, Y-, and Z-axes with respect to the stage, the controller estimates the position of the mark in a direction of a second axis perpendicular to the first axis based on an amount of the rotation shift, moves the stage in the direction of the second axis based on the estimated position of the mark, and then measures the position of the mark by the scope.

7 Claims, 8 Drawing Sheets

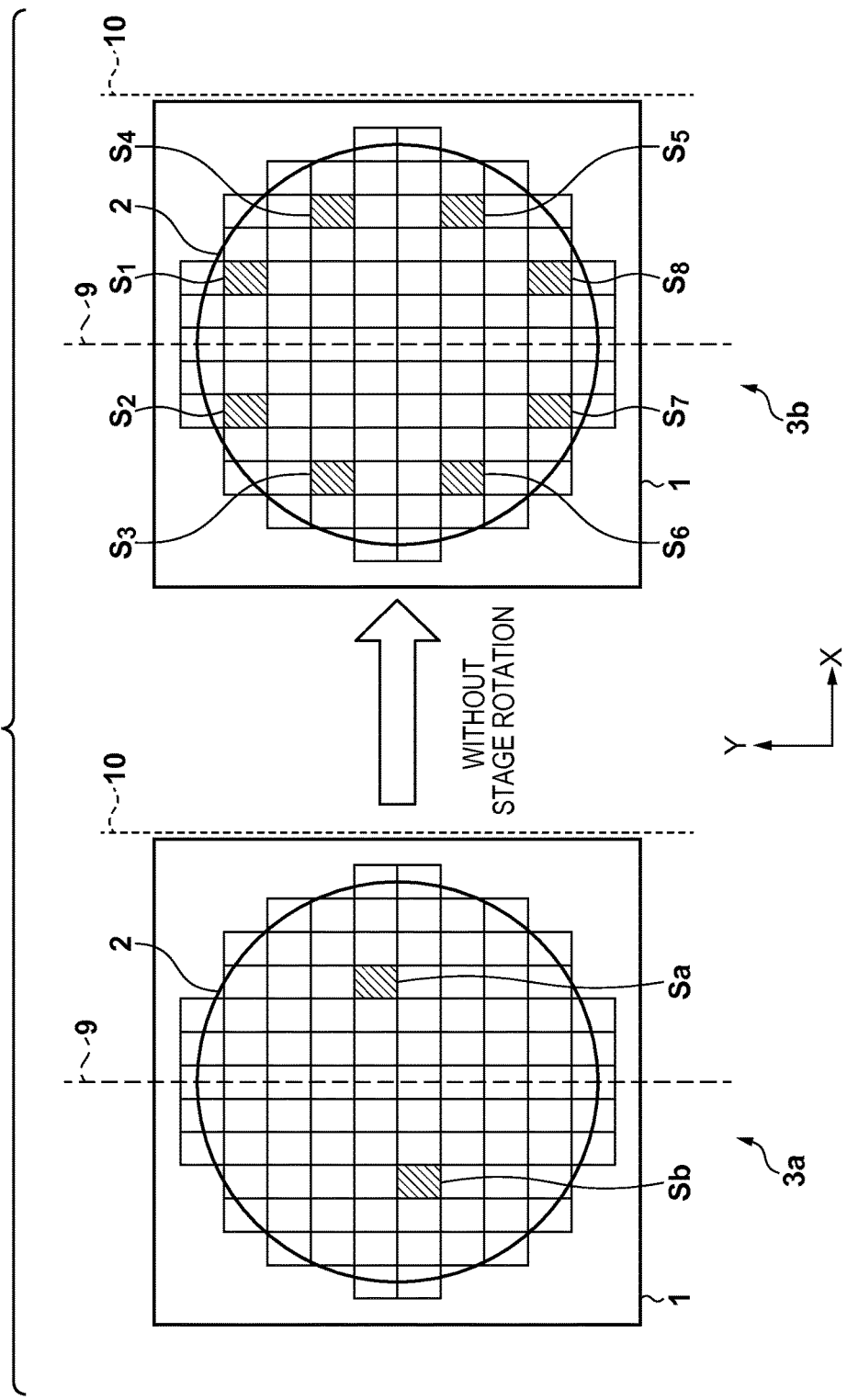

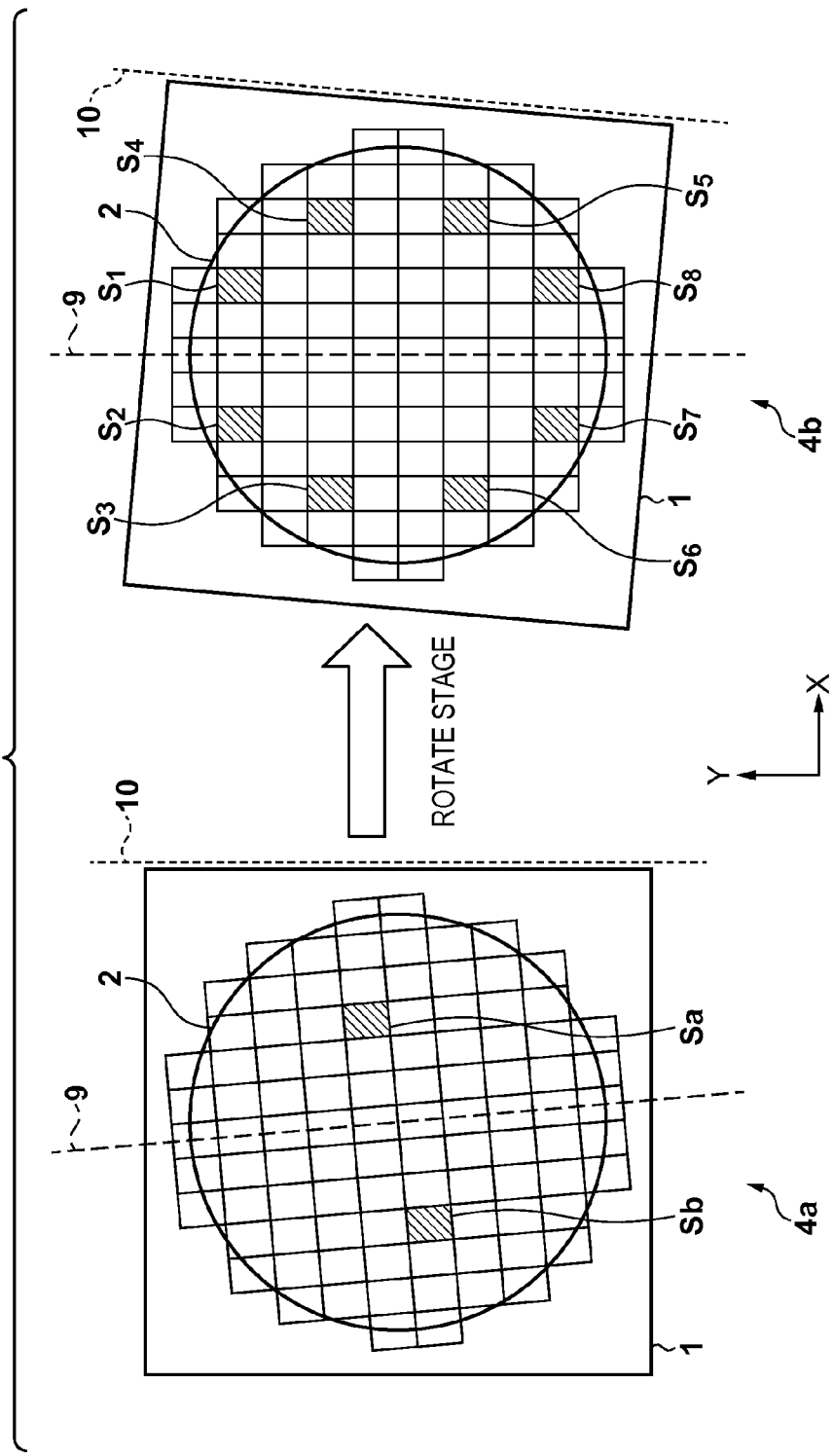

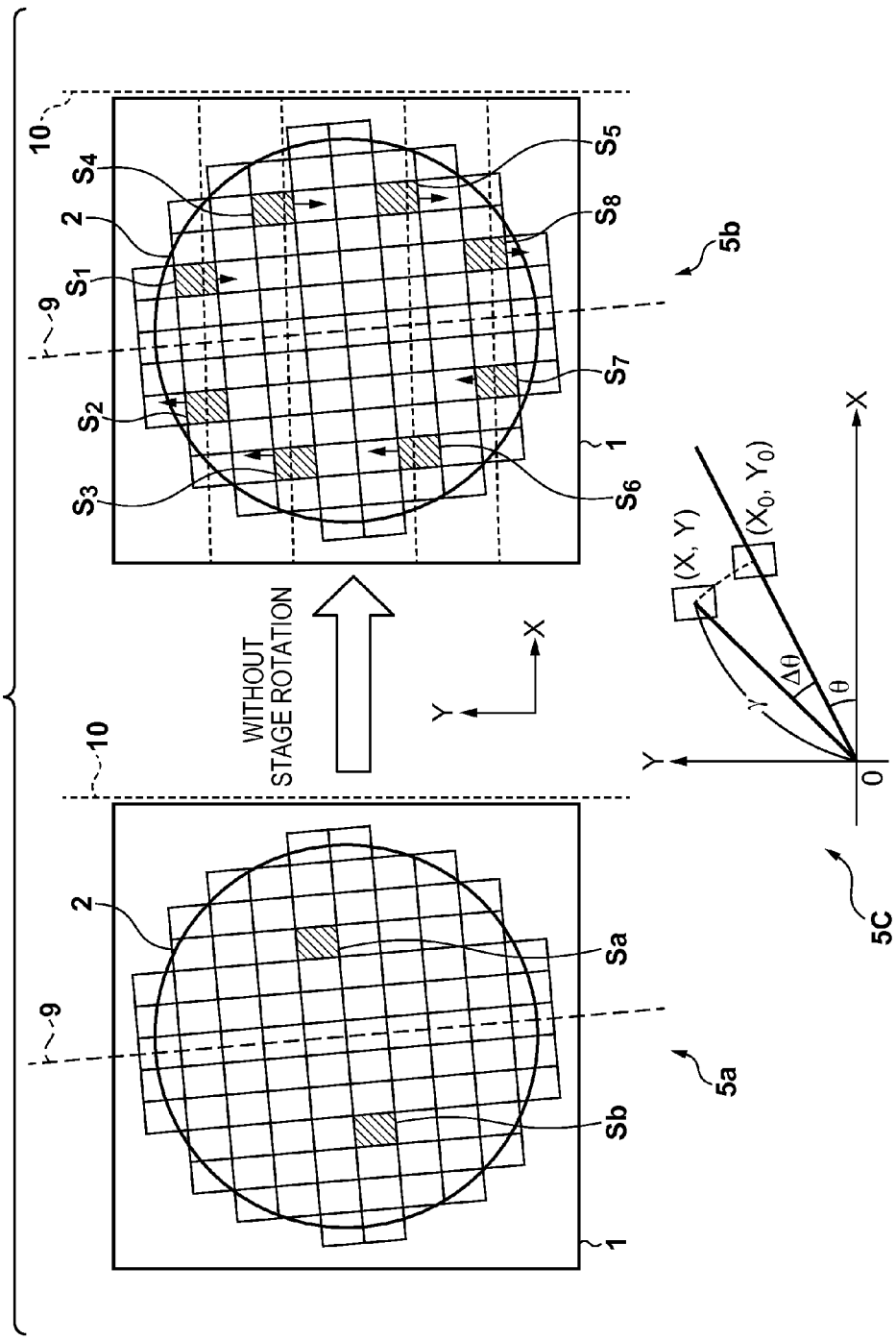

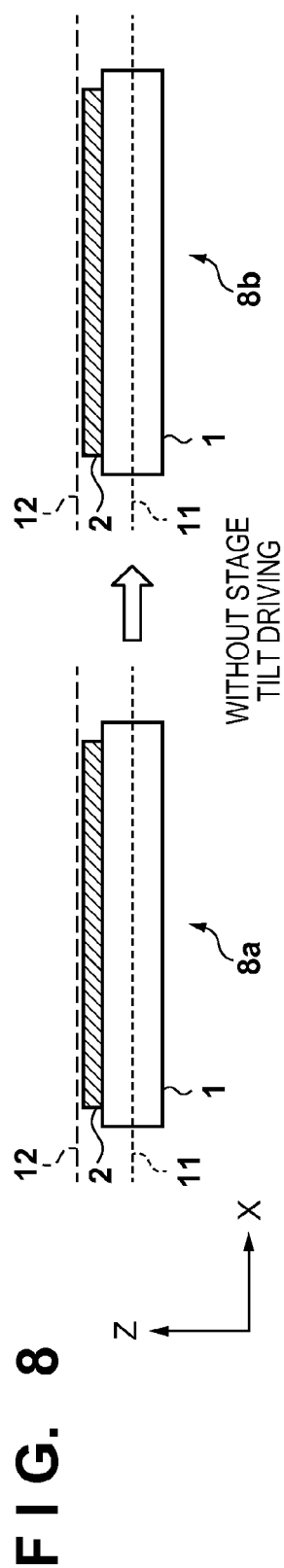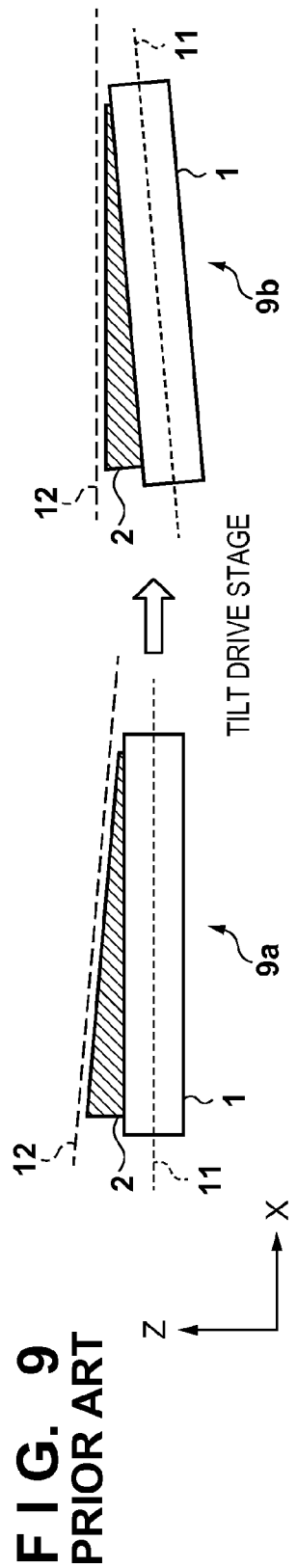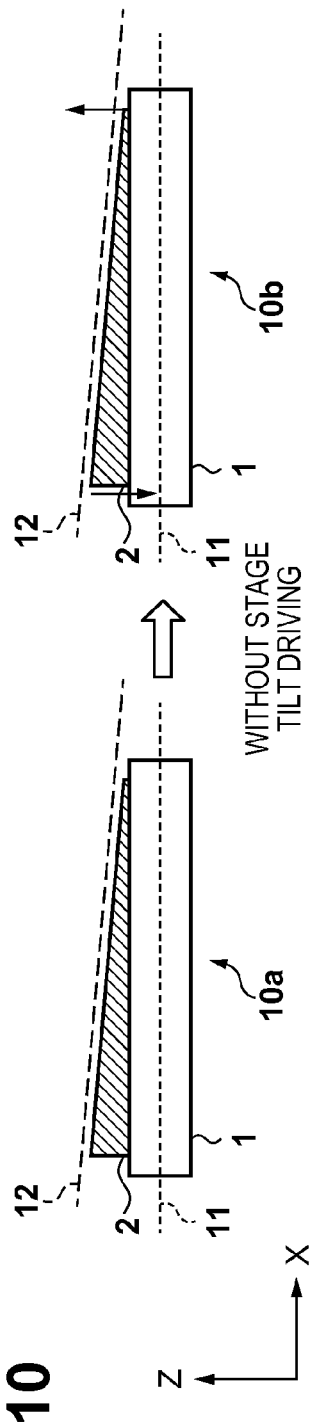

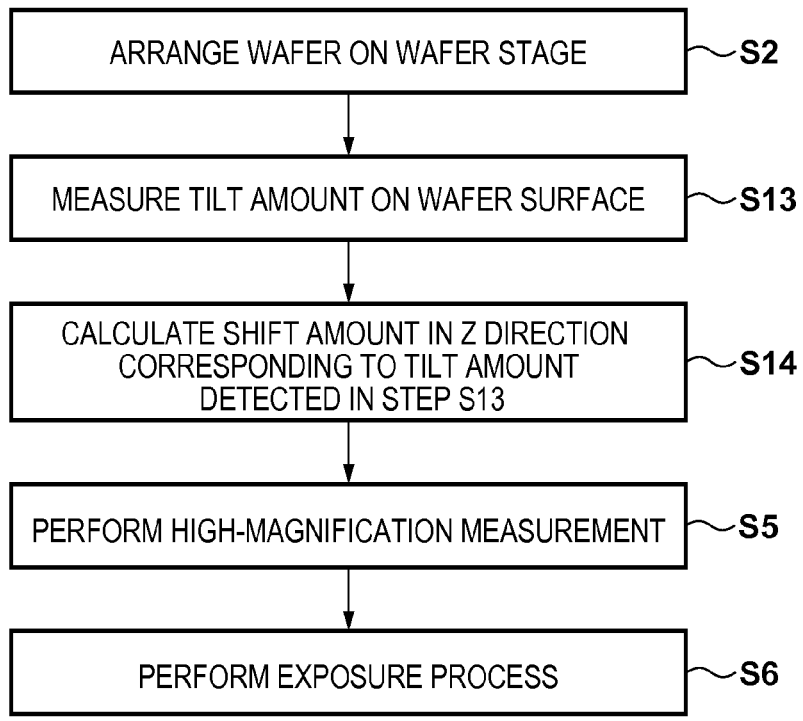
F I G. 12

LITHOGRAPHY APPARATUS, LITHOGRAPHY METHOD, AND ARTICLE MANUFACTURING METHOD

BACKGROUND OF THE INVENTION

Field of the Invention

The present invention relates to a lithography apparatus, a lithography method, and an article manufacturing method.

Description of the Related Art

Along with miniaturization or complication of a circuit pattern, an exposure apparatus for manufacturing a semiconductor device is required to have a technique of accurately exposing an electronic circuit pattern formed on an original (reticle) to light with respect to patterns on a substrate (wafer) in a superimposed manner. Therefore, a technique of accurately measuring an array that has already been patterned on the wafer (alignment measurement) and precisely performing exposure in accordance with its grating or shot shape is important.

An alignment measurement method includes global alignment (a method of predicting an overall array tendency by measuring representative sample shots) and die-by-die alignment (a method of measuring all shots and directly measuring the position of each shot). Global alignment predicts the array tendency of the entire shot by measuring the positions of the representative sample shots and obtains the position of each shot. On the other hand, die-by-die alignment directly measures the position of each shot by observing an original-side mark and a wafer-side mark for each shot. An alignment measurement method to be adopted is determined in accordance with required alignment accuracy or a processing time allowed for an exposure process. A wafer needs to be conveyed from a conveying unit to a stage in order to perform alignment measurement of a pattern on the wafer. When transferring the wafer, a rotation position at the time of transferring the wafer is determined by various methods such as position detection of the notch or the orientation flat of the wafer, or positioning of the outer shape of the wafer.

However, accuracy in determining the rotation position with respect to the stage of the wafer includes at least an error caused by measurement and a transfer error derived from stage accuracy. Even if the wafer can be transferred onto the stage correctly without any rotation positional shift, patterning having a rotation error may have originally been performed on the wafer. It is therefore necessary, when mounting the wafer onto the stage, to perform alignment measurement accurately (at a high magnification) to check the magnitude of a rotation error of the pattern on the wafer with respect to the orthogonal coordinate system of the stage. When performing alignment measurement at a high magnification, rough (low-magnification) measurement is performed in advance to grasp the magnitude of the rotation error of the pattern on the wafer with respect to the orthogonal coordinate system of the stage so as to place a mark in the field of a high-magnification scope. With low-magnification measurement, the rotation shift amount of the pattern is grasped, the stage is rotated by that rotation shift amount, and then alignment measurement is performed at a high magnification.

After low-magnification measurement, when the stage is rotated based on that measurement result, the positional relationship between a bar mirror and an interferometer of the stage changes, and the verticality between the bar mirror and the optical axis of inspection light of the interferometer is deteriorated, causing an Abbe error in high-magnification aliment measurement. This Abbe error may have an influence on the high-magnification alignment measurement result, decreasing overlay accuracy. In order to prevent the decrease in overlay accuracy caused by the Abbe error, Japanese Patent Laid-Open No. 9-260274 and Japanese Patent No. 4449457 each disclose a method of measuring an Abbe error and correcting, with that measurement result, a high-magnification alignment measurement result.

When using the exposure apparatus, the position of the stage which measures marks formed on the wafer by an alignment scope and the position of the stage when exposing the aligned wafer to light via a projection optical system are different. Therefore, when using the stage which controls the position by the interferometer, an encoder, or the like, an influence on positioning accuracy caused by the Abbe error differs between the times of alignment measurement and exposure due to the distortion of the bar mirror itself or the mounting error of the optical system. When mounting the wafer onto the stage, the rotation and the tilt error of the wafer differ for each wafer and for each lot due to position detection of the notch or the orientation flat of the wafer, the positioning error of the outer shape of the wafer, the difference from another exposure apparatus, film thickness unevenness in a process, or the like. Therefore, the positioning error of each wafer is increased in accordance with the rotation position and the tilt orientation of the stage, and is readily influenced (changes).

Therefore, even with the method of correcting the position measurement result of the stage with the measurement result of the Abbe error as in a prior art, the position measurement result itself has an error when, for example, the mounting state of the bar mirror, the interferometer, or the encoder changes in accordance with an elapse time or heat. Not only the exposure apparatus but also another lithography apparatus such as an imprint apparatus or a charged particle beam drawing apparatus has such a problem of the positioning errors of the wafer.

SUMMARY OF THE INVENTION

The present invention provides a lithography apparatus which reduces an error at the time of substrate alignment measurement.

The present invention in one aspect provides a lithography apparatus for forming a pattern on a substrate, the apparatus comprising: a movable stage configured to hold the substrate; a scope configured to measure a position of a mark formed on a surface of the substrate; and a controller configured to control movement of the stage to form the pattern based on the position of the mark measured by the scope, wherein when there is a rotation shift of the surface of the substrate about a first axis of one of X-, Y-, and Z-axes of an XYZ-coordinate system with respect to the stage, the controller estimates the position of the mark in a direction of a second axis perpendicular to the first axis based on an amount of the rotation shift, moves the stage in the direction of the second axis based on the estimated position of the mark, and then measures the position of the mark by the scope.

Further features of the present invention will become apparent from the following description of exemplary embodiments with reference to the attached drawings.

BRIEF DESCRIPTION OF THE DRAWINGS

FIG. 3 shows views of an alignment measurement state;

FIG. 4 shows views of a conventional alignment measurement state;

FIG. 5 shows views of an alignment measurement state according to the first embodiment;

FIG. 8 shows views of an alignment measurement state;

FIG. 9 shows views of a conventional alignment measurement state;

FIG. 10 shows views of an alignment measurement state according to the second embodiment;

FIG. 12 is a flowchart showing an exposure method according to the second embodiment.

DESCRIPTION OF THE EMBODIMENTS

Embodiments of the present invention will be described in detail below with reference to the accompanying drawings.

[Exposure Apparatus]

Figure 1:
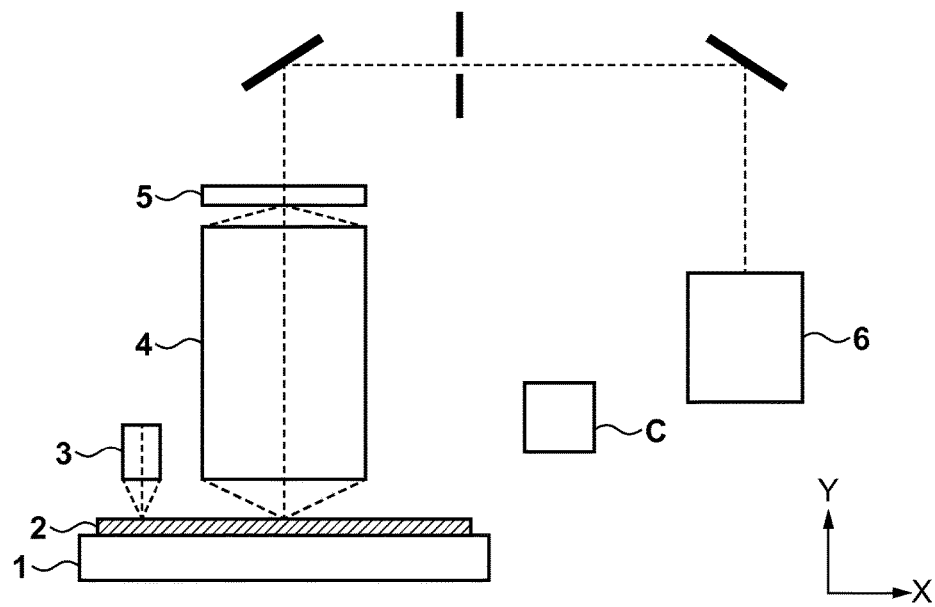
FIG. 1 is a view showing an exposure apparatus of the present invention.

FIG. 1 is a view showing an exposure apparatus of the present invention. As shown in FIG. 1, the exposure apparatus includes a wafer stage (stage) 1 that can move while holding a wafer (substrate) 2, a projection optical system 4, a scope (detector) 3 which detects an alignment mark (mark) formed on the wafer 2, and a controller C. The exposure apparatus positions, based on an alignment mark measurement result by the scope 3, the wafer stage 1 at the time of exposure. Note that in this embodiment, the exposure apparatus which performs exposure by illuminating a reticle (mask) 5 with light from a light source 6 and projecting the pattern of the illuminated reticle 5 onto the wafer 2 is used as a lithography apparatus. In the present invention, however, an imprint apparatus or a charged particle beam drawing apparatus can be used as the lithography apparatus.

Figure 2A:
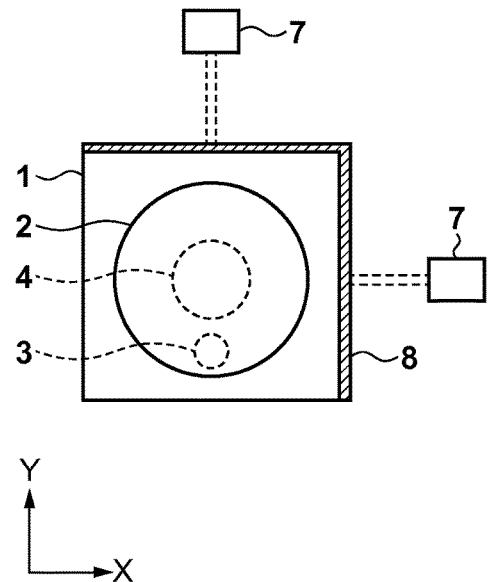
FIGS. 2A and 2B are views showing the exposure apparatus of the present invention.
Figure 2B:
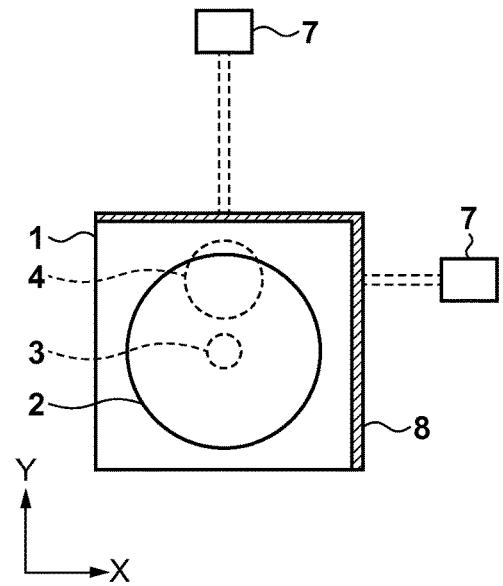

As shown in FIG. 2, a bar mirror region used to measure the position of the stage 1 by interferometers differs between the times of alignment measurement when the mark on the wafer 2 is measured and exposure when patterning is performed on the wafer 2 via the projection optical system 4. Therefore, the influence of an Abbe error to be brought about changes between the times of alignment measurement and exposure. The influence of the Abbe error also changes between the times of alignment measurement and exposure when controlling the position of the wafer stage 1 by using a measurement apparatus other than the interferometers such as encoders. In this embodiment, the Z-axis of an XYZ-coordinate system is set in the irradiation direction of light (energy line) which irradiates the wafer 2 so as to form the pattern, and the X-axis and the Y-axis are set in two perpendicular directions within a plane perpendicular to the irradiation direction.

[First Embodiment]

In each of FIGS. 3 to 5, 3a to 5a show a measurement (first measurement) state in which a rotation $\theta_z$ about the Z-axis (first axis) with respect to a stage 1 of a wafer 2 is measured in advance at a low magnification. In each of FIGS. 3 to 5, 3b to 5b show a state in which, after the first measurement, a rotation angle $\Delta\theta$ about the Z-axis with respect to the stage 1 of the wafer 2 is measured, and then high-magnification alignment measurement (second measurement) for obtaining the position of a shot region used at the time of an exposure process in the X-axis and the Y-axis (second-axis) direction is performed. In the second measurement, the mark is observed at a high magnification in a narrow observation field. Therefore, the moving amount of the stage 1 for placing the mark in that narrow observation field is obtained by performing the first measurement at the low magnification.

FIG. 3 shows a case in which a moving direction 10 of the stage 1 and the direction of a center axis 9 of the wafer 2 itself match ideally when arranging the wafer 2 on the stage 1. In this case, the stage 1 need not be rotated about the Z-axis so as to set the center axis 9 of the wafer 2 in a direction parallel to the moving direction 10 of the stage 1 before performing the second measurement. Therefore, the influence of the Abbe error is constant.

As in 4a of FIG. 4, however, the moving direction 10 of the stage 1 and the center axis 9 of the wafer 2 may not be parallel to each other. In this case, the angle $\theta_z$ made by the moving direction 10 of the stage 1 and the center axis 9 of the wafer 2 can be measured by measuring the positions of two marks Sa and Sb shown in 4a of FIG. 4 at a low magnification. Conventionally, in such a case, in the second measurement, the stage 1 is rotated by only the angle $\theta_z$, the moving direction 10 of the stage 1 and the center axis 9 of the wafer 2 are made parallel to each other, and then the positions of marks S1 to S8 formed on a sample shot are measured at a high magnification, as shown in 4b of FIG. 4. Therefore, in the second measurement, the influence of the Abbe error changes by the marks S1 to S8 and the Abbe error needs to be corrected in order to obtain the marks S1 to S8.

As in 4a of FIG. 4, 5a in FIG. 5 shows a case in which the moving direction 10 of the stage 1 and the center axis 9 of the wafer 2 are not parallel to each other. As in 5c of FIG. 5, let $(X_0, Y_0)$ be the X- and Y-coordinates of the mark without any rotation shift, $(r, \theta)$ be polar coordinates, and $(X, Y)$ be the X- and Y-coordinates of the mark when the wafer 2 shifts for rotation by $\Delta\theta$ with respect to the stage 1. Accordingly, X and Y can be indicated as below by using $X_0$, $Y_0$, and $\Delta\theta$.

$$X = r\cos(\theta + \Delta\theta) = r\cos\theta\cos\Delta\theta - r\sin\theta\sin\Delta\theta = X_0\cos\Delta\theta - Y_0\sin\Delta\theta$$

$$Y = r\sin(\theta + \Delta\theta) = r\sin\theta\cos\Delta\theta + r\cos\theta\sin\Delta\theta = Y_0\cos\Delta\theta + X_0\sin\Delta\theta$$

That is, because the wafer 2 shifts for rotation by $\Delta\theta$ with respect to the stage 1, the X- and Y-coordinates of the mark shift by $\Delta X$ and $\Delta Y$ indicated blow.

$$\Delta X = X - X_0 = X_0(1 - \cos\Delta\theta) - Y_0\sin\Delta\theta$$

$$\Delta Y = Y - Y_0 = Y_0(1 - \cos\Delta\theta) + X_0\sin\Delta\theta$$

Therefore, even if the wafer 2 shifts for rotation by $\Delta\theta$ with respect to the stage 1, the mark can be placed in the high-magnification observation field in the second measurement by shifting the stage 1 without rotation with estimation that the mark is shifted by $\Delta X$ and $\Delta Y$ as in 5b of FIG. 5. In the second measurement according to the first embodiment shown in 5b of FIG. 5, the moving direction 10 of the stage 1 is perpendicular to the optical-axis direction of inspection light of a measurement device. It is therefore possible, in the second measurement according to the first embodiment, to perform high-magnification alignment measurement without influencing the Abbe error by the rotation shift amount of the wafer 2.

Figure 6:
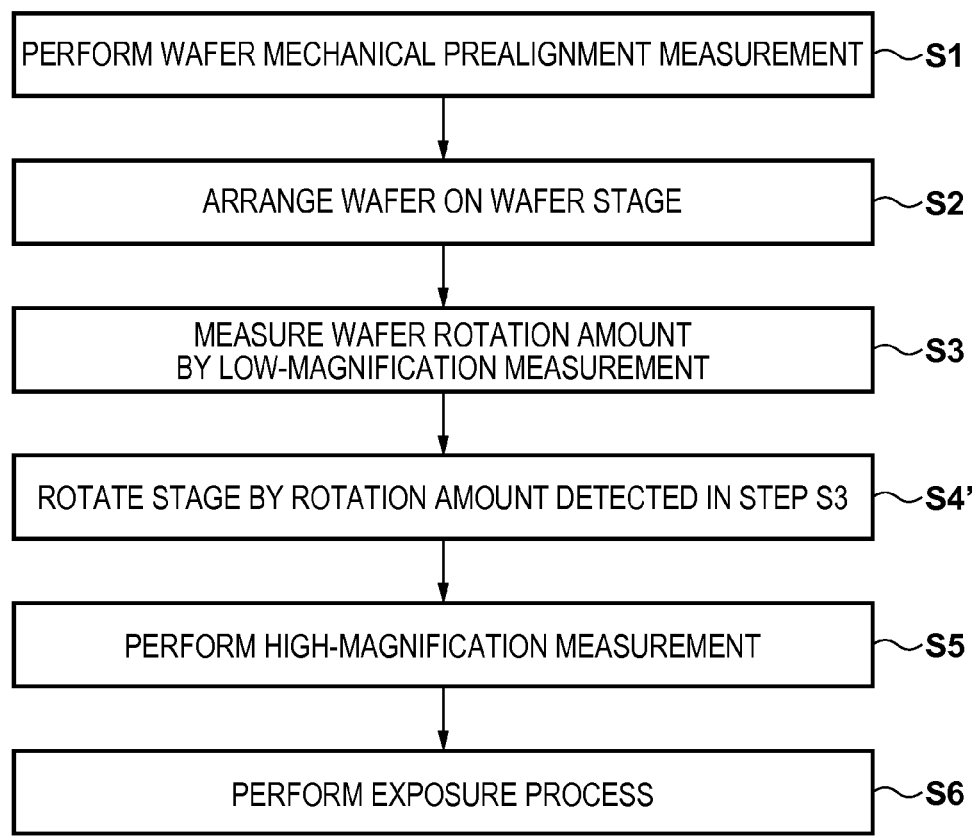
FIG. 6 is a flowchart showing a conventional exposure method.
Figure 7:
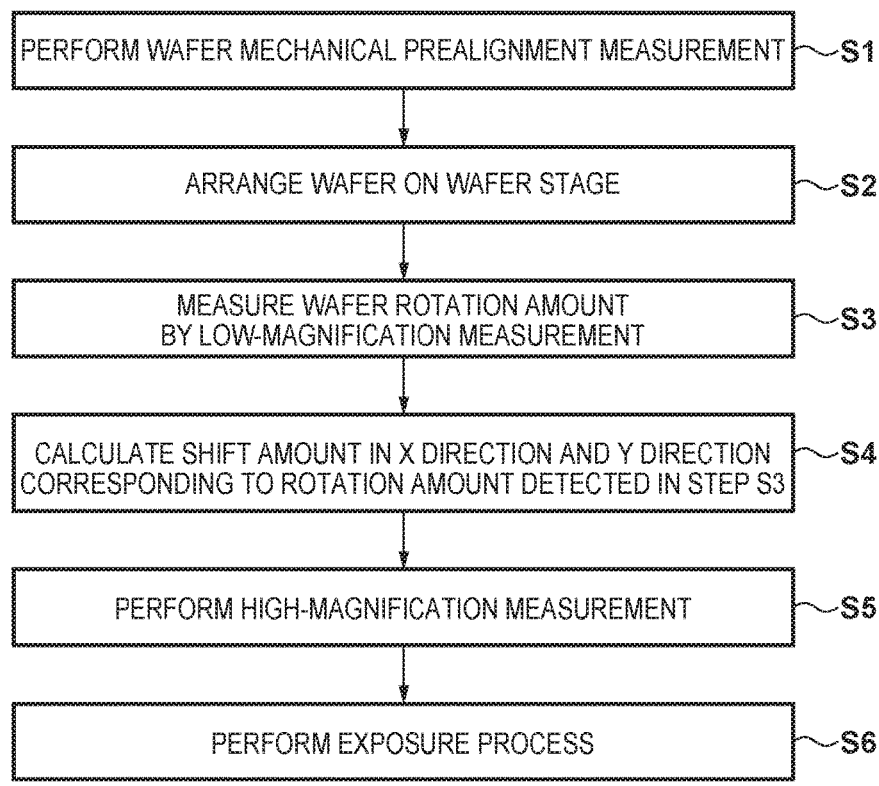
FIG. 7 is a flowchart showing an exposure method according to the first embodiment.

FIGS. 6 and 7, respectively, show a prior art and an exposure method according to the first embodiment when the wafer 2 has the rotation shift about the Z-axis with respect to the stage 1. As shown in FIG. 7, in the exposure method according to the first embodiment, a controller C performs mechanical prealignment measurement in which the position of the notch or the orientation flat of the wafer 2 is detected on a mechanical prealignment stage in step S1. In step S2, the controller C arranges the wafer 2 on the stage 1 based on the mechanical prealignment measurement result in step S1. In step S3, the controller C observes the positions of the marks Sa and Sb at the low magnification by using the scope 3, and measures the rotation shift $\theta_z$ of the wafer 2 about the Z-axis with respect to the stage 1. In step S4, the controller C calculates the shift amount in the X direction and the Y direction of each of the marks S1 to S8 corresponding to the rotation shift amount measured in step S3. In step S5, the controller C shifts the stage 1 based on the position of each mark on the wafer 2 and the shift amount of each mark calculated in step S4, and places each mark in the high-magnification observation field of the scope 3. After moving the stage 1, the controller C measures the position of each mark accurately by the scope 3. In step S6, the controller C performs the exposure process on each shot region while positioning the stage 1 based on the measurement result in step S5. In the conventional exposure method, when the wafer 2 has the rotation shift about the Z-axis with respect to the stage 1, the controller C rotates the stage 1 by the rotation shift amount measured in step S3 and performs the second measurement in that state in step S4'.

[Second Embodiment]

In each of FIGS. 8 to 10, 8a to 10a show a measurement (first measurement) state in which a rotation $\theta_Y$ about the Y-axis (first axis) on the surface of a wafer 2 is measured in advance at a low magnification. A case in which the rotation $\theta_Y$ about the Y-axis is measured will be described here. However, the same also applies to a case in which a rotation $\theta_X$ about the X-axis is measured. The rotations $\theta_X$ and $\theta_Y$ about the X-axis and the Y-axis on the surface of the wafer 2 are referred to as tilts on the surface of the wafer 2. In each of FIGS. 8 to 10, 8b to 10b show a state in which, after the first measurement, the rotation about the Y-axis on the surface of the wafer 2 is measured, and then high-magnification alignment measurement (second measurement) for obtaining the position of a shot region used at the time of an exposure process is performed. In the second measurement, a mark is observed in a narrow observation field at a high magnification. In the second measurement, inspection light from a scope 3 needs to be focused on the position of the mark in the Z-axis (second-axis) direction so as to measure the position of the mark accurately. Therefore, as shown in FIG. 8, when no tilt exists on the surface of the wafer 2, a stage 1 need not be rotated (tilt driven) about the Y-axis before performing the second measurement after the first measurement.

As shown in FIG. 9, however, when the tilt is measured on the surface of the wafer 2 in the first measurement, Z positions on the surface of the wafer 2 need to be aligned by tilt driving the stage 1 about the Y-axis by a tilt amount measured in the first measurement before performing the second measurement in a conventional exposure method. As a result, the side surface of a bar mirror provided on the stage 1 where inspection light from interferometers 7 enters is no longer perpendicular to the optical axis of inspection light and an Abbe error is influenced by the tilt driving mount of the stage 1. To cope with this, in the second embodiment, a shift amount in the Z direction corresponding to the tilt amount on the surface of the wafer 2 measured in the first measurement is obtained for each mark to be measured in the second measurement, as shown in FIG. 10. In the second embodiment, the position of each mark is measured accurately while shift driving the stage 1 in the Z direction based on the shift amount of each mark in the Z direction and positioning each mark to the focused position (focal point) of the scope 3 without tilt driving the stage 1 after the first measurement.

Figure 11:
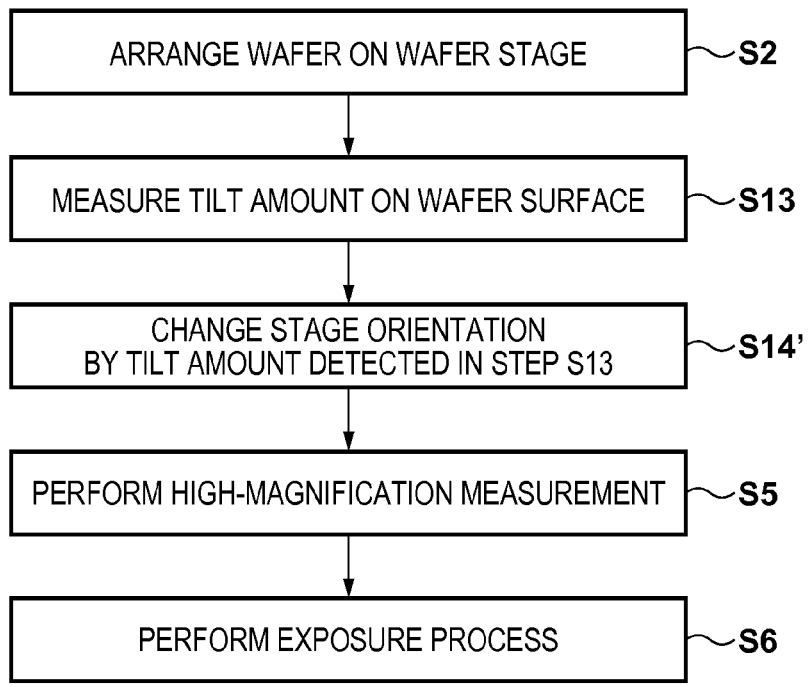
FIG. 11 is a flowchart showing a conventional exposure method.

FIGS. 11 and 12, respectively, show a prior art and an exposure method according to the second embodiment when a tilt shift exists on the surface of the wafer 2. As shown in FIG. 12, in the exposure method according to the second embodiment, a controller C arranges the wafer 2 on the stage 1 in step S2. As in the first embodiment, mechanical prealignment measurement can be performed before step S2. In step S13, the controller C measures the rotation shift (tilt) about the X-axis and the Y-axis on the surface of the wafer 2. In step S14, the controller C calculates the shift amount in the Z direction of each of marks S1 to S8 corresponding to the tilt amount measured in step S13. In step S5, the controller C shift drives the stage 1 based on the X and Y positions of each mark on the wafer 2, and the shift amount of each mark in the Z direction calculated in step S14 to place each mark in the focused position (focal point) in the observation field of the scope 3, thereby measuring the position of each mark accurately. In step S6, the controller C performs the exposure process on each shot region while positioning the stage 1 based on the measurement result in step S5. In the conventional exposure method, when the tilt exists on the surface of the wafer 2, the controller C tilt drives the stage 1 by the tilt amount measured in step S13 and performs the second measurement in that state in step S14'.

[Article Manufacturing Method]

A manufacturing method of a device (a semiconductor integrated circuit device, a liquid crystal display device, a MEMS, or the like) as an article includes a step of transferring (forming) a pattern on a substrate (a wafer, a glass plate, a film-like substrate, or the like) by using the above-described exposure apparatus. The manufacturing method can also include a step of etching the substrate onto which the pattern has been transferred. Note that when manufacturing another article such as a patterned medium (storage medium) or an optical element, the manufacturing method can include, instead of an etching step, another process step of processing the substrate onto which the pattern has been transferred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-231051, filed Nov. 13, 2014, which is hereby incorporated by reference herein in its entirety.

What is claimed is:

1. A lithography apparatus for forming a pattern on a substrate, the apparatus comprising:
   a movable stage configured to hold the substrate, the stage including a bar mirror;
   a scope configured to measure a position of a mark formed on the substrate;
   a measurement device including an interferometer configured to measure a position of a surface of the bar mirror to determine a position of the stage about one of an X-axis or a Y-axis of an XYZ-coordinate system by causing light to be incident on the surface of the bar mirror on the stage; and a controller configured to control movement of the stage to form the pattern based on the position of the mark measured by the scope, wherein the controller is configured to control the scope to make a first measurement to measure a first position of a first mark, calculate an amount of a rotation shift of the substrate about a first axis of an other one of the one of the X-axis or the Y-axis of the XYZ-coordinate system with respect to the stage based on the first position of the first mark, estimate a second position of a second mark in a direction of a second axis, corresponding to a Z-axis of the XYZ-coordinate system, perpendicular to the first axis and an optical axis of the light based on the calculated amount of the rotation shift of the substrate, move the stage in the direction of the second axis based on the estimated second position without rotating the stage about the first axis, and control the scope to make a second measurement to measure a third position of the second mark in a direction of one of the X-axis or the Y-axis.

2. The apparatus according to claim 1, wherein the first position, the second position, and the third position are positions in a direction of the Z-axis.

3. The apparatus according to claim 1, wherein the controller is configured to control the scope to make the first measurement at a first magnification and the second measurement at a second magnification higher than the first magnification.

4. The apparatus according to claim 1, wherein the controller is configured to form the pattern by moving the stage based on the position of the mark measured by the scope and the position of the stage measured by the measurement device.

5. The apparatus according to claim 1, wherein the controller is configured to control the scope to make the first measurement to measure positions of at least two first marks.

6. A lithography method of forming a pattern on a substrate held by a movable stage including a bar mirror, the method comprising:

measuring a position of a surface of the bar mirror to determine a position of the stage about one of an X-axis or a Y-axis of an XYZ-coordinate system by causing light to be incident on the surface of the bar mirror on the stage;

measuring a first position of a first mark;

calculating an amount of a rotation shift of the substrate about a first axis of an other one of the one of the X-axis or the Y-axis of the XYZ-coordinate system with respect to the stage based on the first position of the first mark;

estimating a second position of a second mark in a direction of a second axis, corresponding to a Z-axis of the XYZ-coordinate system, perpendicular to the first axis and an optical axis of the light based on the calculated amount of the rotation shift of the substrate;

moving the stage in the direction of the second axis based on the second position without rotating the stage about the first axis;

measuring a third position of the second mark in a direction of one of the X-axis or the Y-axis after moving the stage; and forming the pattern by moving the stage based on the measured third position.

7. A method of manufacturing an article, the method comprising:

forming a pattern on a substrate by using a lithography apparatus; and processing the substrate, on which the pattern has been formed, to manufacture the article, the lithography apparatus including:

a movable stage configured to hold the substrate, the stage including a bar mirror;

a scope configured to measure a position of a mark formed on the substrate;

a measurement device including an interferometer configured to measure a position of a surface of the bar mirror to determine a position of the stage about one of an X-axis or a Y-axis of an XYZ-coordinate system by causing light to be incident on the surface of the bar mirror on the stage; and a controller configured to control movement of the stage to form the pattern based on the position of the mark measured by the scope, wherein the controller is configured to control the scope to make a first measurement to measure a first position of a first mark, calculate an amount of a rotation shift of the substrate about a first axis of an other one of the one of the X-axis or the Y-axis of the XYZ-coordinate system with respect to the stage based on the first position of the first mark, estimate a second position of a second mark in a direction of a second axis, corresponding to a Z-axis of the XYZ-coordinate system, perpendicular to the first axis and an optical axis of the light based on the calculated amount of the rotation shift of the substrate, move the stage in the direction of the second axis based on the estimated second position without rotating the stage about the first axis, and control the scope to make a second measurement to measure a third position of the second mark in a direction of one of the X-axis or the Y-axis.

* * * * *